United States Patent
Hung

(10) Patent No.: US 10,283,637 B2
(45) Date of Patent: May 7, 2019

(54) INDIVIDUALLY-TUNABLE HEAT REFLECTORS IN AN EPI-GROWTH SYSTEM

(71) Applicant: TAIWAN SEMICONDUCTOR MANUFACTURING CO., LTD., Hsin-Chu (TW)

(72) Inventor: Shih-Wei Hung, Kaohsiung (TW)

(73) Assignee: TAIWAN SEMICONDUCTOR MANUFACTURING CO, LTD., Hsin-Chu (TW)

( * ) Notice: Subject to any disclaimer, the term of this patent is extended or adjusted under 35 U.S.C. 154(b) by 301 days.

(21) Appl. No.: 15/212,691

(22) Filed: Jul. 18, 2016

(65) Prior Publication Data

US 2018/0019136 A1  Jan. 18, 2018

(51) Int. Cl.
| | |
|---|---|
| F27B 5/14 | (2006.01) |
| H01L 29/78 | (2006.01) |
| H01L 21/67 | (2006.01) |
| H05B 3/00 | (2006.01) |
| H05B 31/00 | (2006.01) |
| H01L 21/8238 | (2006.01) |
| H01L 29/66 | (2006.01) |
| H01L 29/165 | (2006.01) |
| H01L 21/324 | (2006.01) |

(52) U.S. Cl.
CPC .... H01L 29/7848 (2013.01); H01L 21/67115 (2013.01); H05B 3/0047 (2013.01); H05B 31/0072 (2013.01); H01L 21/324 (2013.01); H01L 21/823814 (2013.01); H01L 29/165 (2013.01); H01L 29/66636 (2013.01); H01L 29/66795 (2013.01)

(58) Field of Classification Search
None
See application file for complete search history.

(56) References Cited

U.S. PATENT DOCUMENTS

| | | | |
|---|---|---|---|
| 4,728,777 A * | 3/1988 | Tsisios | H05B 3/0076 219/405 |
| 6,123,766 A | 9/2000 | Williams et al. | |
| 7,018,479 B2 | 3/2006 | Goodwin | |
| 7,269,343 B2 | 9/2007 | Koren et al. | |
| 7,725,012 B2 * | 5/2010 | Aggarwal | H01L 21/67115 118/725 |

(Continued)

Primary Examiner — Joseph M Pelham
(74) Attorney, Agent, or Firm — Haynes and Boone, LLP

(57) ABSTRACT

A semiconductor fabrication system includes a wafer carrier configured to carry a wafer thereon. A radiation source is positioned above the wafer carrier. The radiation source is configured to emit thermal radiation. A plurality of reflectors is positioned above, and aligned with, an edge region of the wafer. The reflectors each have a reflective coating configured to reflect the thermal radiation. A plurality of separately-controllable motors is coupled to the reflectors, respectively. The motors are each configured to cause its respective reflector to rotate in a counterclockwise direction or a clockwise direction so as to redirect the thermal radiation back toward the edge region of the wafer. A controller is communicatively coupled to the plurality of motors. The controller is configured to control each of the motors separately to cause each motors to rotate independently of other motors.

20 Claims, 11 Drawing Sheets

(56) References Cited

U.S. PATENT DOCUMENTS

| | | | |
|---|---|---|---|
| 7,772,527 B2* | 8/2010 | Choi | F27B 5/04 |
| | | | 219/405 |
| 7,949,237 B2 | 5/2011 | Koren et al. | |
| 8,426,778 B1* | 4/2013 | Bolt | B05D 3/067 |
| | | | 219/405 |
| 8,716,841 B1 | 5/2014 | Chang et al. | |
| 8,736,084 B2 | 5/2014 | Cheng et al. | |
| 8,837,810 B2 | 9/2014 | Chen et al. | |
| 2005/0098553 A1* | 5/2005 | Devine | F27B 17/0025 |
| | | | 219/411 |
| 2006/0165904 A1* | 7/2006 | Ohara | H01L 21/67115 |
| | | | 427/372.2 |
| 2008/0175571 A1* | 7/2008 | Aggarwal | H01L 21/67115 |
| | | | 392/416 |
| 2012/0308112 A1 | 12/2012 | Hu et al. | |
| 2013/0201461 A1 | 8/2013 | Huang et al. | |
| 2013/0258304 A1 | 10/2013 | Chang et al. | |
| 2014/0101624 A1 | 4/2014 | Wu et al. | |
| 2014/0111779 A1 | 4/2014 | Chen et al. | |
| 2014/0119638 A1 | 5/2014 | Chang et al. | |
| 2014/0123084 A1 | 5/2014 | Tang et al. | |
| 2014/0226893 A1 | 8/2014 | Lo et al. | |
| 2014/0253901 A1 | 9/2014 | Zhou et al. | |
| 2014/0256067 A1 | 9/2014 | Cheng et al. | |
| 2014/0257761 A1 | 9/2014 | Zhou et al. | |

* cited by examiner

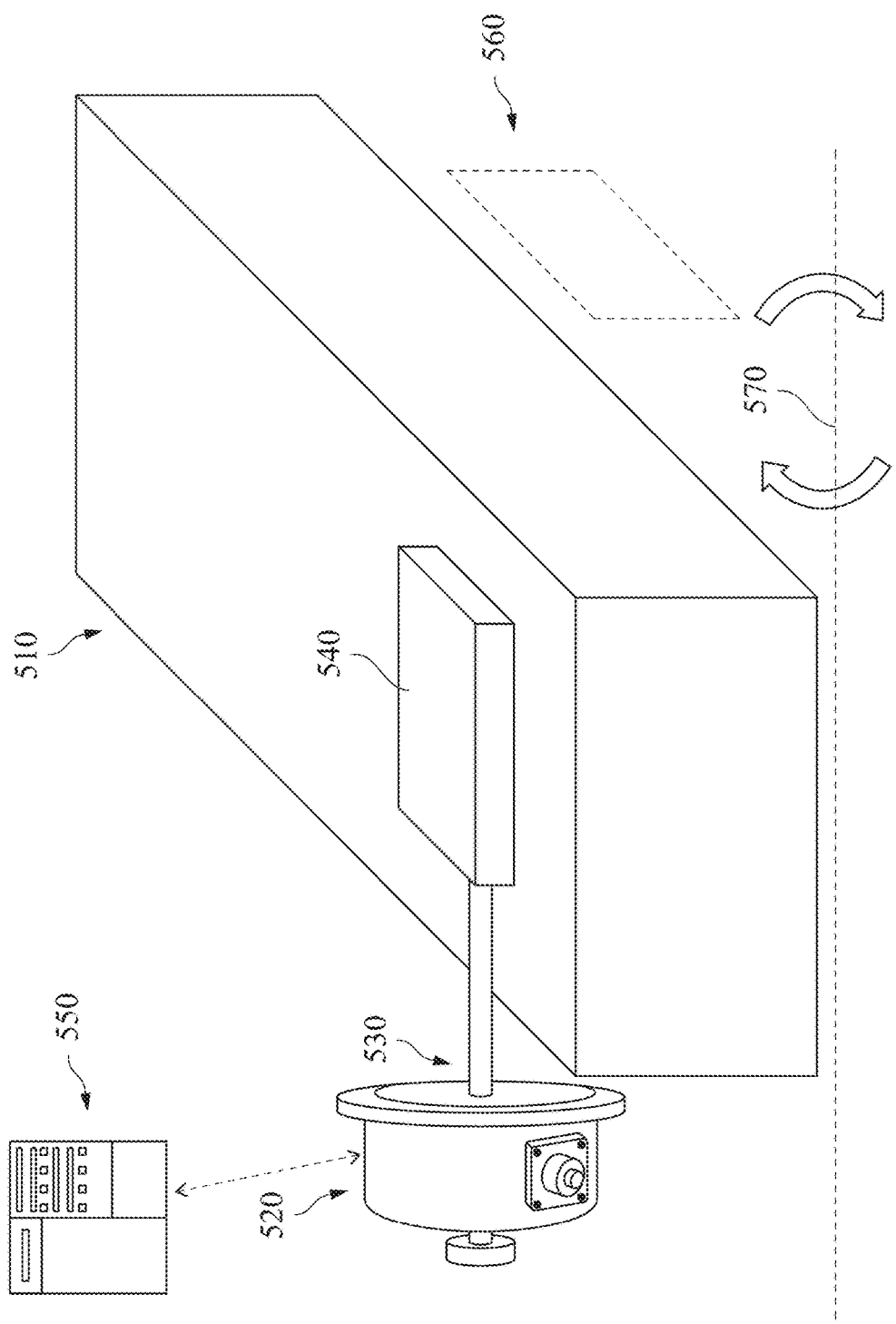

INDIVIDUALLY-TUNABLE HEAT REFLECTORS IN AN EPI-GROWTH SYSTEM

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. For example, semiconductor device fabrication may involve forming one or more layers (e.g., source/drain) through an epitaxial growth process. The epitaxial growth process involves applying heat to the wafer. As geometry sizes shrink, for example down to the 10-nanometer node or smaller nodes, the heat application in the epitaxial growth process may not be adequately uniform for fabrication purposes. In some instances, an edge region of the wafer may not receive sufficient heat. As a result, semiconductor device performance is degraded.

Therefore, although existing methods and devices of heating the wafer in an epitaxial process have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8, 9A, 9B, 9C, and 9D are views of a heat-reflector according to various embodiments of the present disclosure.

DETAILED DESCRIPTION

Figure 1:
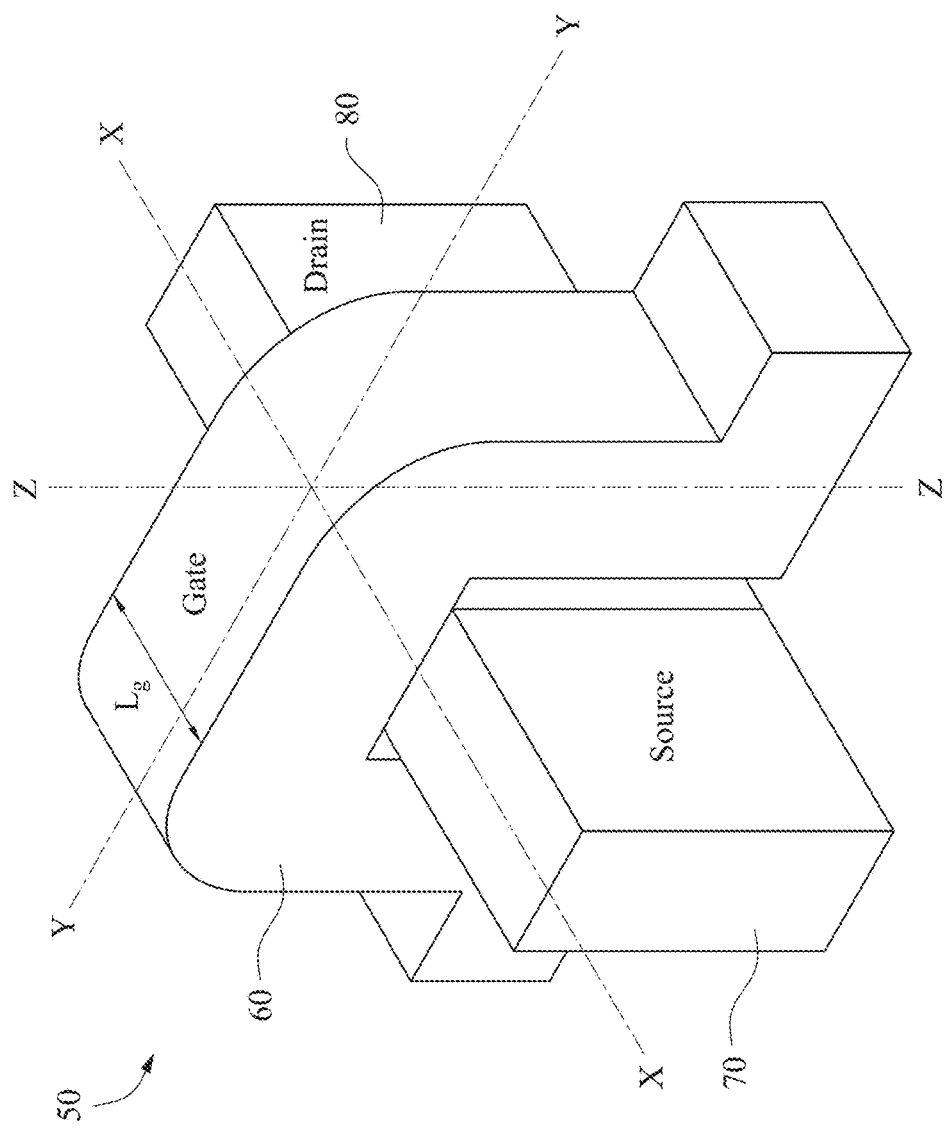
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technologies continue to advance, traditional fabrication systems and methods may encounter various problems. For example, the fabrication of semiconductor devices may involve using an epitaxial process to form various components of a semiconductor device, such as source/drain regions or the channel of a transistor. In these epitaxial processes, thermal energy (e.g., heat) is applied to the surface of the wafer, on which the epitaxial layer is formed. In order to achieve good semiconductor device performance, it is desirable for this heat to be applied evenly or uniformly across the surface of the wafer. Unfortunately, existing methods and systems of performing epitaxial processes typically suffer from poor wafer edge heating. In other words, the portions of the wafer located near the outer edges tend to receive less heat than other portions of the wafer, for example less than the portions of the wafer located near the center. Existing systems and methods have not been able to implement a satisfactory solution to this wafer edge heating problem. Consequently, semiconductor device performance is degraded.

FIGS. 1-4 provide example contexts in which an epitaxial process may be performed to form various microelectronic components.

Referring to FIG. 1, a perspective view of an example FinFET device 50 is illustrated. The FinFET is used as an example semiconductor device to illustrate various aspects (e.g., with respect to epitaxial processes) of the present disclosure, though it is understood that the present disclosure is not limited to FinFETs. A FinFET—or a fin-like field-effect transistor (FinFET) device—may be a complementary metal-oxide-semiconductor (CMOS) device including a P-type metal-oxide-semiconductor (PMOS) FinFET device and/or an N-type metal-oxide-semiconductor (NMOS) FinFET device.

The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 2:
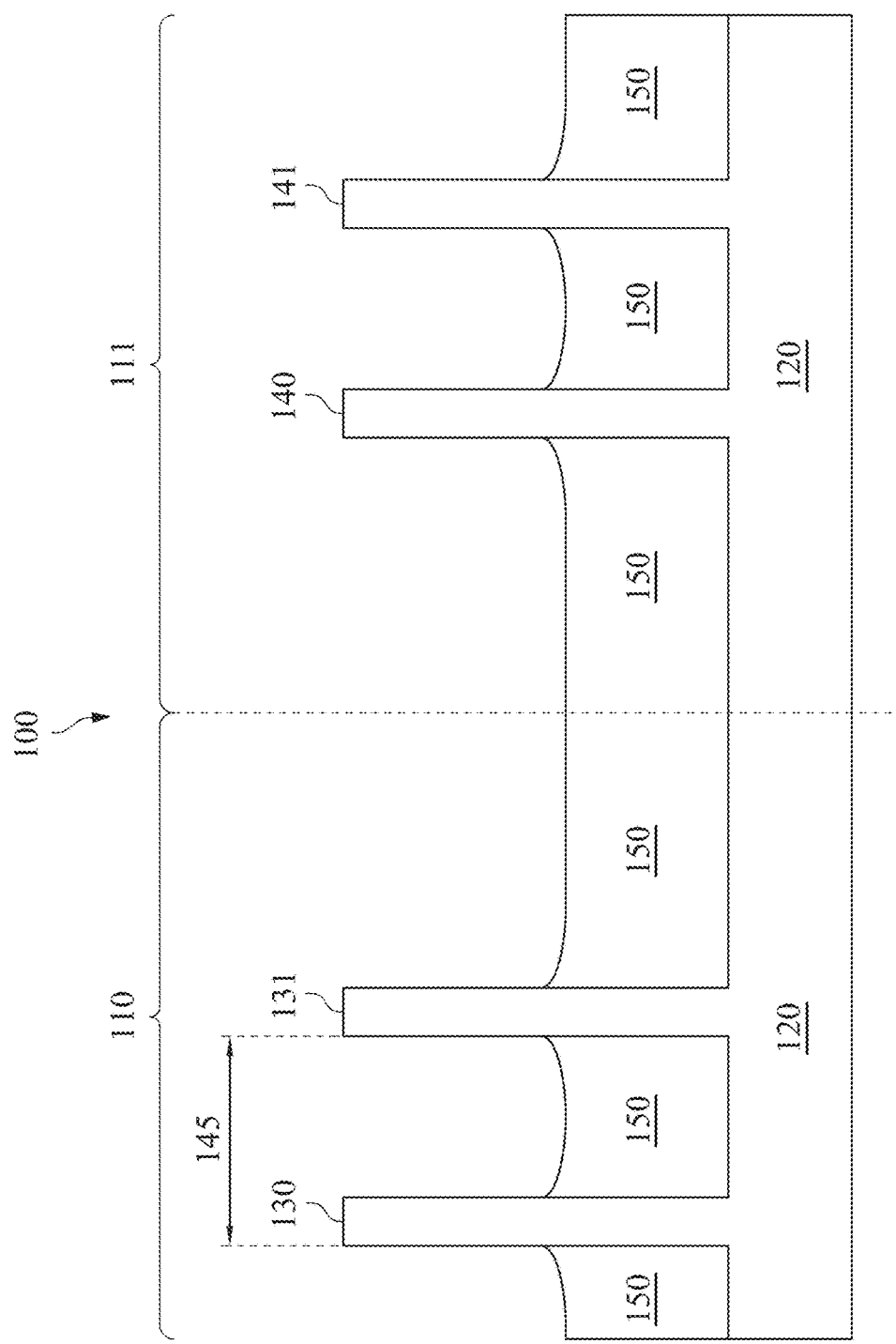
FIGS. 2-3 are different cross-sectional side views of a semiconductor device at different stages of fabrication according to various embodiments of the present disclosure.
Figure 3:
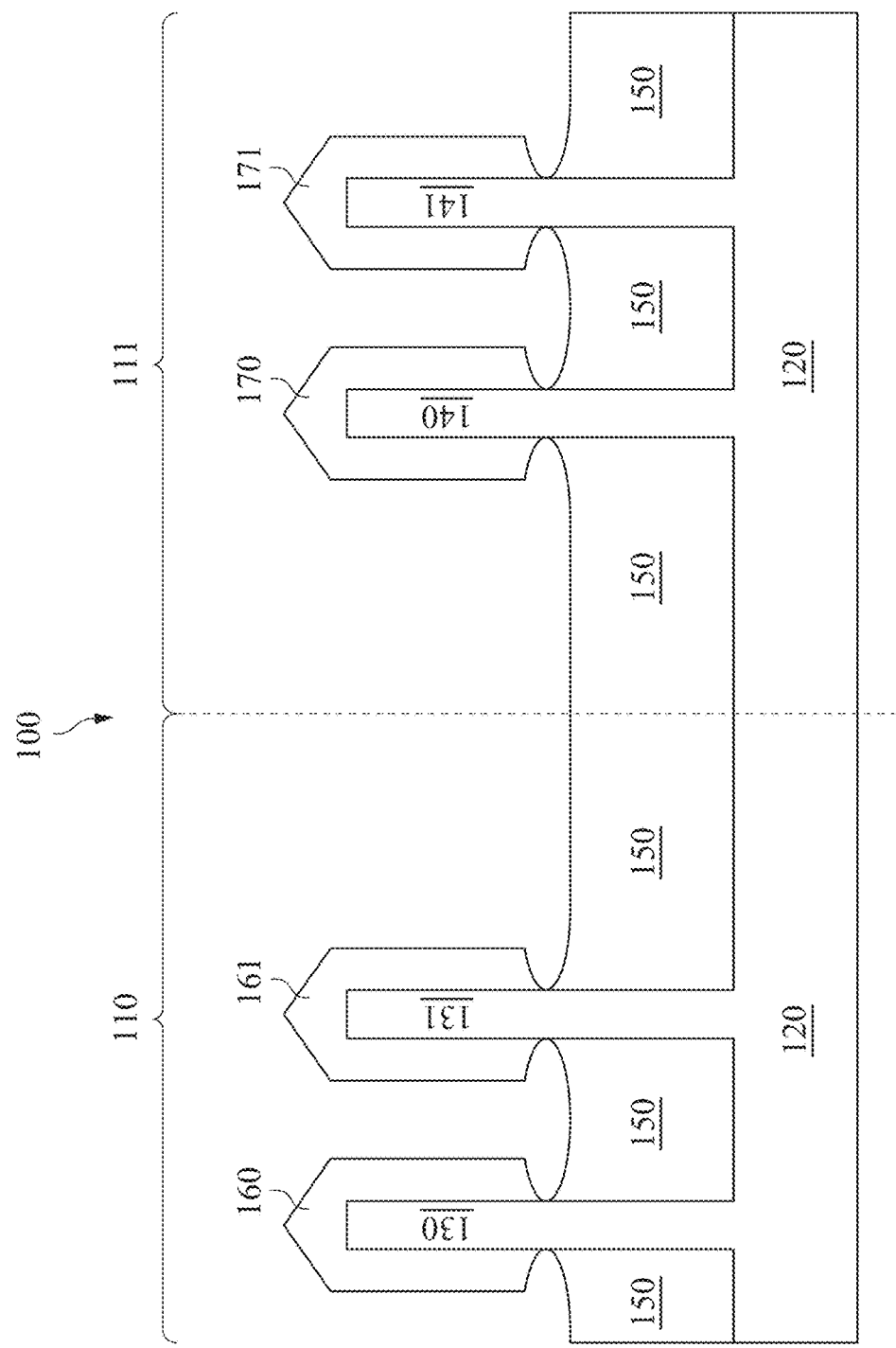
Figure 4:
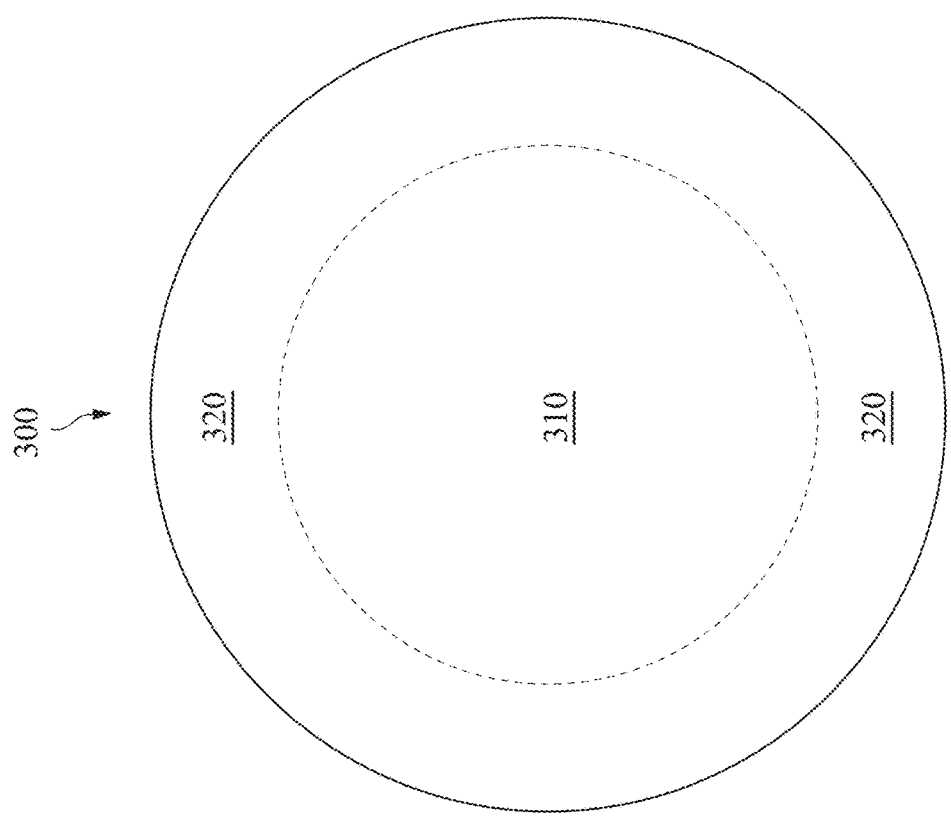
FIG. 4 is a top view of a semiconductor wafer according to various embodiments of the present disclosure.

FIGS. 2-3 are simplified diagrammatic fragmentary cross-sectional side views of a FinFET 100 undergoing various fabrication steps according to embodiments of the present disclosure. The FinFET 100 includes a region 110 and a region 111. In some embodiments, the region 110 may be a "core" region, and the region 111 may be a "frame" region. In some other embodiments, the region 110 is a PMOS region, and the region 111 is an NMOS region. In yet other embodiments, the region 110 is an NMOS region, and the region 111 is a PMOS region.

The regions 110 and 111 each include a semiconductor layer 120 is formed on a substrate (e.g., a dielectric substrate or a semiconductor substrate). In an embodiment, the semiconductor layer 120 includes a crystal silicon material. An implantation process may be performed to implant a plurality of dopant ions to the semiconductor layer 120. The dopant ions may include an n-type material in some embodiments, for example arsenic (As) or phosphorous (P), or they may include a p-type material in some other embodiments, for example boron (B), depending on whether an NMOS or a PMOS is needed.

The region 110 includes fins 130 and 131, and the region 111 includes fins 140 and 141. The fins 130-131 and 140-141 are formed by patterning the semiconductor layer 120 via a lithography process, which include steps such as photoresist deposition, exposure, developing, baking, etc. (not necessarily performed in that order). A patterned photoresist formed may then be used to pattern the semiconductor layer 120 below to form the fins 130-131 and 140-141 by etching away portions of the layer 120 not protected by the patterned photoresist. In various embodiments, portions of the fins 130-131 or 140-141 may serve as the source, drain, or channel regions of the FinFET 100.

The fins 130-131 and 140-141 are isolated from one another by isolation structures 150. The isolation structures 150 may also be referred to as shallow trench isolation (STI) structures. In some embodiments, the isolation structures 150 contain a dielectric material such as silicon oxide or silicon nitride. The isolation structures 150 may be formed by depositing the dielectric material to fill the openings formed when the fins 130-131 and 140-141 are etched and then performing a polishing process (such as chemical mechanical polishing) to planarize the surface.

Referring now to FIG. 3, source/drain epi-layers 160-161 are formed on and around the fins 130-131, and source/drain epi-layers 170-171 are formed on and around the fins 140-141. The source/drain epi-layers 160-161 and 170-171 are formed by an epitaxial growth process. In other words, the source/drain epi-layers 160-161 and 170-171 are epitaxially grown on the exposed surfaces of the fins 130-131 and 140-141. In some embodiments, the source/drain epi-layers 160-161 and 170-171 contain silicon germanium (SiGe). In other embodiments, the source/drain epi-layers 160-161 and 170-171 contain silicon carbide (SiC), or some other suitable material.

To address these problems, the present disclosure implements individually-tunable heat reflectors to accurately and flexibly control the heat distribution across the surface of a wafer in an epitaxial process, as discussed below in more detail with reference to FIGS. 5-11.

Figure 5:
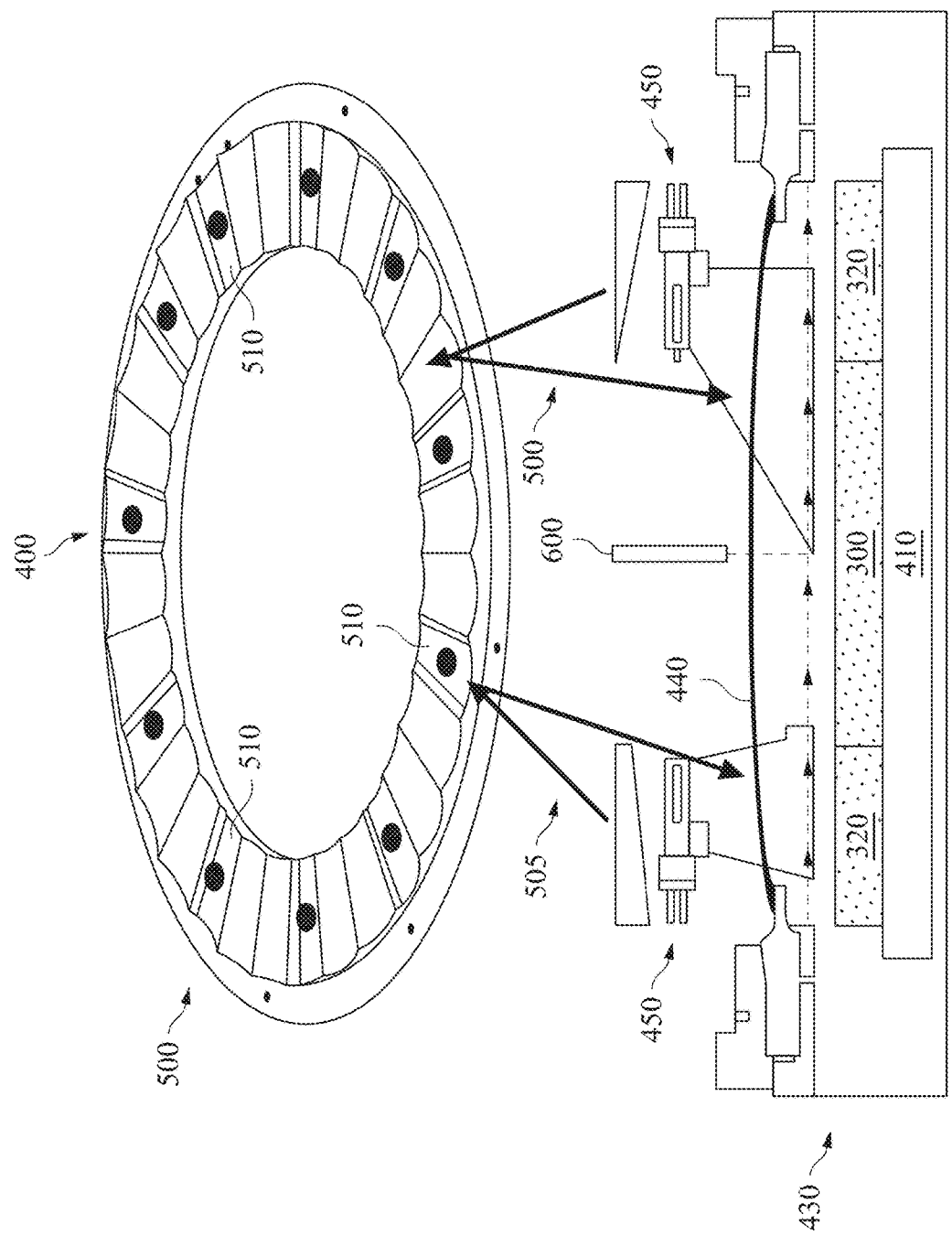
FIG. 5 is a diagrammatic view of a semiconductor fabrication apparatus according to various embodiments of the present disclosure.
Figure 6:
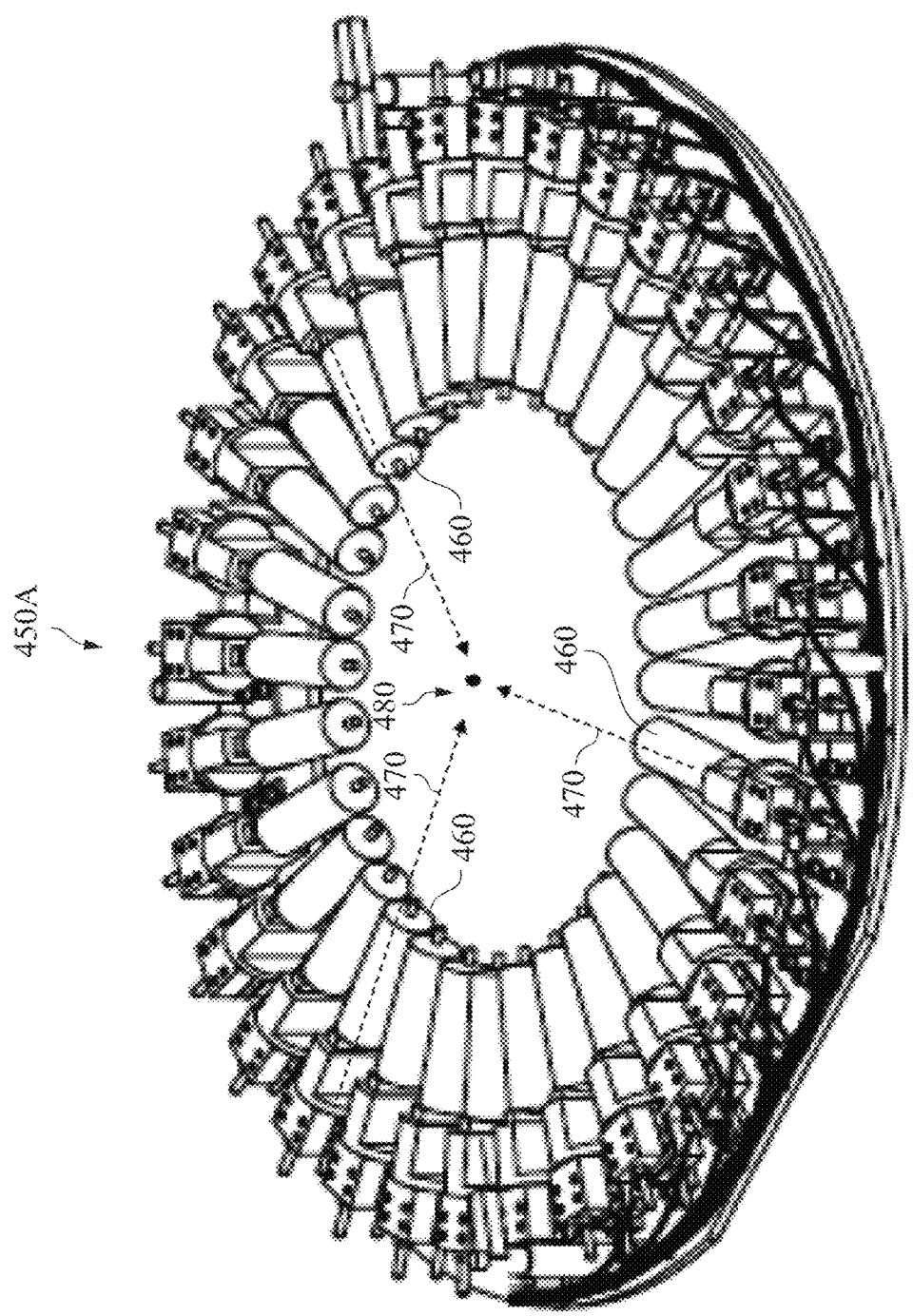
FIGS. 6 and 7A-7B are views of a heating source according to various embodiments of the present disclosure.

FIG. 5 illustrates a simplified diagrammatic view of a semiconductor fabrication apparatus 400 (as a part of a semiconductor fabrication system) for performing an epitaxial process. The semiconductor fabrication apparatus 400 includes a wafer holder or wafer carrier 410. The wafer carrier 410 may include a wafer chuck, for example an e-chuck in some embodiments. The wafer carrier 410 is configured to hold or carry a wafer, for example the wafer 300 (discussed above with reference to FIG. 4) thereon. The wafer 300 is supposed to undergo an epitaxial process according to various aspects of the present disclosure. The wafer carrier 410 and the wafer 300 are positioned inside a processing chamber 430. In some embodiments, the processing chamber 430 may be in a vacuum environment. To ensure the vacuum environment, a quartz cover 440 is positioned above the wafer carrier 410 (and above the wafer 300). Though the quartz cover 440 provides a vacuum seal, it still allows radiation such as thermal radiation to penetrate therethrough.

The semiconductor fabrication apparatus 400 also includes a radiation source or a heat source 450. The heat source 450 produces radiation in the form of thermal energy, so as to heat the wafer 300 below. In an embodiment shown in FIG. 6, an embodiment 450A of the heat source 450 includes a plurality of elongate-shaped tubular lamps that are illustrated in a perspective view. In more detail, the heat source 450A shown in FIG. 6 includes a plurality of elongated tubular lamps, some of which are designated with the reference numeral 460 as examples. Each of these tubular lamps 460 contains a radiation-generating element therein, such as a heat-producing filament. The tubular lamps 460 each extend along a respective axis 470 that radially extends toward a center point 480 (this center point 480 would be vertically aligned with a center point of the wafer 300). The tubular lamps 460 are also disposed above, and vertically aligned with, the edge region 320 of the wafer 300.

Figure 7A:
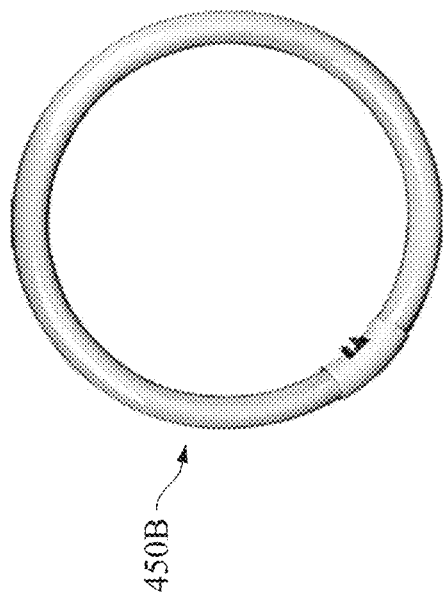
Figure 7B:
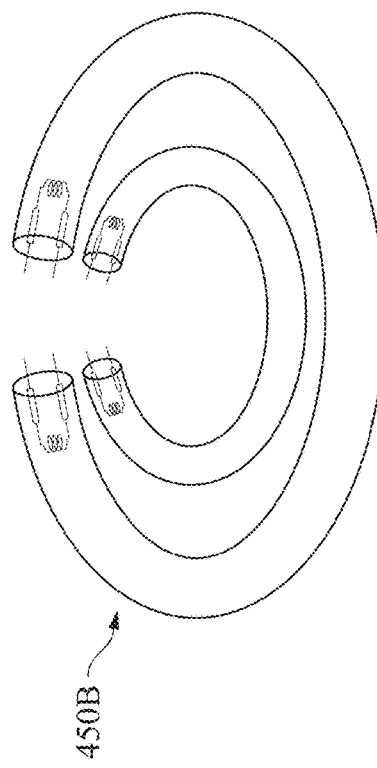

FIGS. 7A and 7B illustrate diagrammatic views of another embodiment 450B of the heat source 450. The heat source 450B in FIGS. 7A-7B includes a circular lamp. Alternatively stated, the lamp has a ring-like circular structure. FIG. 7A shows a top view of this circular lamp, and FIG. 7B shows a perspective view of the circular lamp in two different sizes, where each size is configured to accommodate a different wafer. The circular lamp contains a radiation-generating element therein, such as a heat-producing filament. In the embodiment shown in FIGS. 7A-7B, the heat source 450B (i.e., the circular lamp) is also disposed above, and vertically aligned with, the edge region 320 of the wafer 300.

Referring back to FIG. 5, the semiconductor fabrication apparatus 400 includes a reflective structure 500. The reflective structure 500 is configured to reflect radiation 505 (in the form of thermal energy generated by the heat source 450) back toward the wafer 300. It is understood that FIG. 5 shows a perspective view of a "bottom" surface of the reflective structure 500. In other words, the reflective structure 500 as illustrated in FIG. 5 would be "flipped upside down" in operation, so that the "bottom" surface—which is the surface illustrated in FIG. 5—can reflect the thermal radiation back down toward the wafer 300.

In accordance with various aspects of the present disclosure, the reflective structure 500 includes a plurality of individually-tunable reflectors 510. The reflectors 510 are individually-tunable in a manner such that they can be individually controlled to rotate according to programming instructions. As such, each reflector 510 can bend or rotate in a specific angle to reflect the radiation to a desired region of the wafer 300. Since the edge region 320 of the wafer 300 is the region that generally suffers from insufficient heating, the reflectors 510 may be programmed to rotate in a way to reflect the heat toward the edge region 320. However, it is understood that the heat may be reflected to other regions of the wafer if needed, merely by tuning the angle for which each reflector 510.

FIG. 8 illustrates a simplified diagrammatic perspective view of an example one of the reflectors 510 according to an embodiment. The reflector 510 has a motor 520 coupled thereto. For example, via an axle 530, the motor 520 may be coupled to a protruding portion 540 of the reflector 510. The motor 520 is communicatively coupled to a controller 550 and operates according to instructions received from the controller 550. The controller 550 is a part of a semiconductor fabrication system, and it may be configured to control various processing tools such as the epitaxial growth chamber. A user may configure the controller 550 to set the processing parameters/recipes, including processing time/duration, temperature, voltage, pressure, etc.

Among other things, a user can program the controller 550 to rotate the motor 520 as desired. In some embodiments, the motor 520 is configured to rotate in a counterclockwise manner. In other embodiments, the motor 520 is configured to rotate in a clockwise manner. In yet other embodiments, the motor 520 is configured to rotate in either a clockwise manner or a counterclockwise manner. The clockwise rotation and the counterclockwise rotation are both defined in a plane 560 that is perpendicular to a surface of the wafer 300 (shown in FIG. 5). In other words, such a plane 560 is a vertical plane that would intersect with the upper surface of the wafer 300 at a 90 degree angle.

The clockwise rotation or counterclockwise rotation of the motor 520 causes the reflector 510 to rotate about (or around) an imaginary axis 570, in either a clockwise manner or a counterclockwise manner, depending on exactly how the motor 520 is configured to rotate. The axis 570 extends in parallel to a surface of the wafer 300 (shown in FIG. 5). The axis 570 is also orthogonal (or perpendicular) to the plane 560. In some embodiments, the reflector 510 is configured to rotate at an angular velocity between about 10 revolutions per minute (rpm) and about 50 rpm. Such angular velocity ensures that the reflector 510 can be rotated fast enough to not slow down fabrication, but also sufficiently slow to ensure that a desired rotation angle can be achieved for the reflector 510.

Figure 9B:
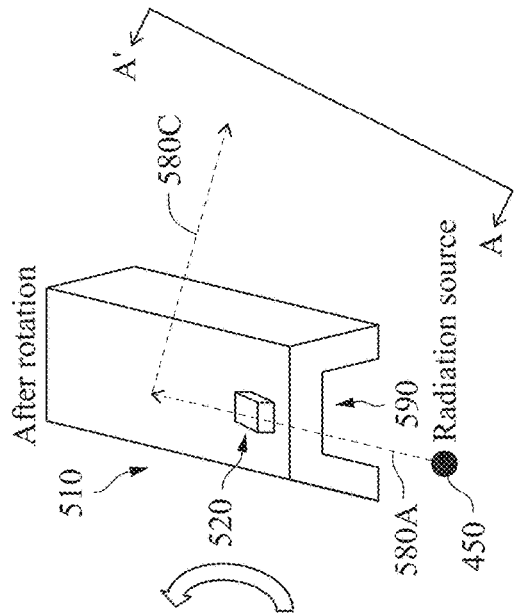
Figure 9D:
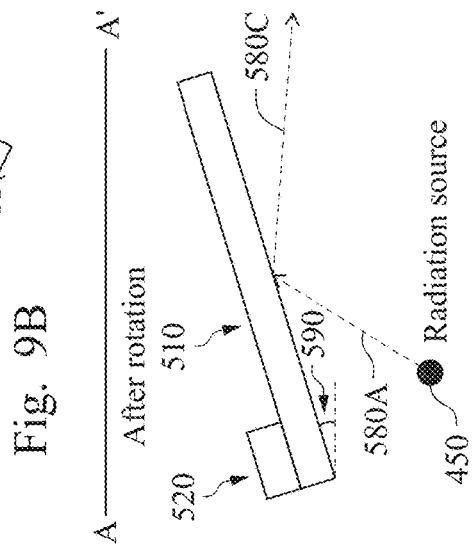
Figure 9A:
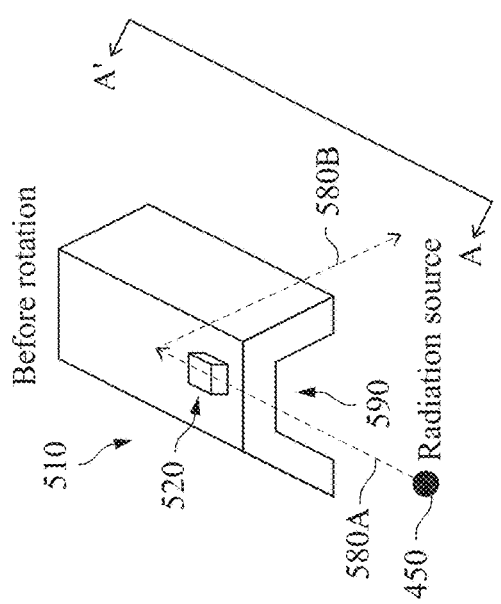
Figure 9C:
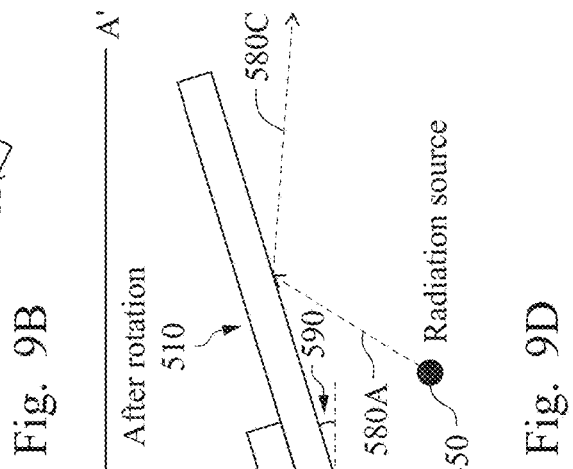

FIGS. 9A, 9B, 9C, and 9D illustrate the operation of one of the individual reflectors 510 in more detail. Specifically, FIGS. 9A and 9B illustrate a simplified perspective view of the reflector 510 before and after a rotation, respectively, and FIGS. 9C and 9D illustrate a simplified cross-sectional view of the reflector 510 before and after the rotation, respectively. The cross-sectional view shown in FIG. 9C is taken across the reflector 510 shown in FIG. 9A from point A to point A'. The cross-sectional view shown in FIG. 9D is taken across the reflector 510 shown in FIG. 9B from point A to point A'.

Referring to FIGS. 9A and 9C, the reflector 510 is at a normal (un-rotated) position. In other words, the reflector 510 is horizontally level. It can be seen that the reflector 510 forms a downward-facing cup 590. In other words, the reflector 510 defines a downward-facing (i.e., facing the wafer 300 and the radiation source 450) opening or recess 590. In embodiments where the radiation source 450 is in the form of a plurality of discrete sources, for example the tubular lamps in FIG. 6, each reflector 510 may be disposed above, and vertically aligned with a respective one of the discrete sources.

A reflective coating is applied on the surfaces of the recess 590. For example, the reflective coating may contain a metal material, such as gold. Therefore, an incident radiation 580A produced by the radiation source 450 is reflected by the bottom surfaces of the reflector 510 (i.e., upon hitting the reflective coating applied on the surfaces of the recess 590) as reflected radiation 580B.

Suppose that a portion or region of the wafer 300 is not receiving sufficient heat, and the reflected radiation 580 needs to be redirected to apply more heat to that region of the wafer 300. In that case, the motor 520 (under instructions from the controller 550) can rotate the reflector 510, so as to produce new reflected radiation directed toward that region of the wafer. This is shown in FIGS. 9B and 9D, where a portion of the reflector 510 opposite of the motor 520 is rotated or tilted "upward." In some embodiments, a rotation angle 590 is in a range from about −30 degrees to about 60 degrees, where a negative rotation angle indicates that the reflector 510 is tilted in a manner so as to reflect radiation toward an inner region of the wafer 300, and a positive rotation angle indicates that the reflector 510 is tilted in a manner so as to reflect radiation toward an outer region of the wafer 300.

As a result of the rotation of the reflector 510, the incident radiation 580A is now reflected as reflected radiation 580C. Comparing the trajectories of the reflected radiation 580B (shown in FIGS. 9A and 9C) and the reflected radiation 580C (shown in FIGS. 9B and 9D), it is apparent that different parts of the wafer 300 are being heated before and after the rotation of the reflector 510. In some embodiments, the edge region 320 of the wafer 300 (shown in FIGS. 4-5) is the portion of the wafer needing more heat. Therefore, the reflector 510 is rotated so that the reflected radiation 580C propagates toward the edge region 320.

Although FIGS. 9A-9D show the operation of a single reflector 510, it is understood that a plurality of the reflector 510 (e.g., all of them, or any combination of a subset of them) may be rotated in a similar manner to apply more heat to the edge region 320 of the wafer. Of course, these reflectors 510 may also be rotated with different rotation angles 590 so as to create different temperature zones across the wafer surface, if that is needed in a particular application.

Referring back to FIG. 5, a pyrometer 600—a type of remote-sensing thermometer used to detect the temperature of a surface—may be used to measure the temperature at any given region of the wafer 300. In some embodiments, the pyrometer 600 may be used in conjunction with the motor 520 and the controller 550 as a part of a feedback loop. For example, the pyrometer 600 may be communicatively coupled to the controller 550 and may report its measurements back to the controller 550. If the temperature of a particular region of the wafer 300 measured by the pyrometer 600 is higher than anticipated or allowed, then the controller 550 may instruct the motor 520 to rotate one or more of the reflectors 510 to direct heat (generated by the radiation source 450) away from that region. On the other hand, if the temperature of a particular region of the wafer 300 measured by the pyrometer 600 is lower than anticipated or allowed, then the controller 550 may instruct the motor 520 to rotate one or more of the reflectors 510 to direct heat (generated by the radiation source 450) toward that region. In this manner, the fabrication apparatus or system 400 of the present disclosure can achieve temperature uniformity across the wafer surface if that is desired, or different thermal intensity regions if that is desired.

Figure 10:
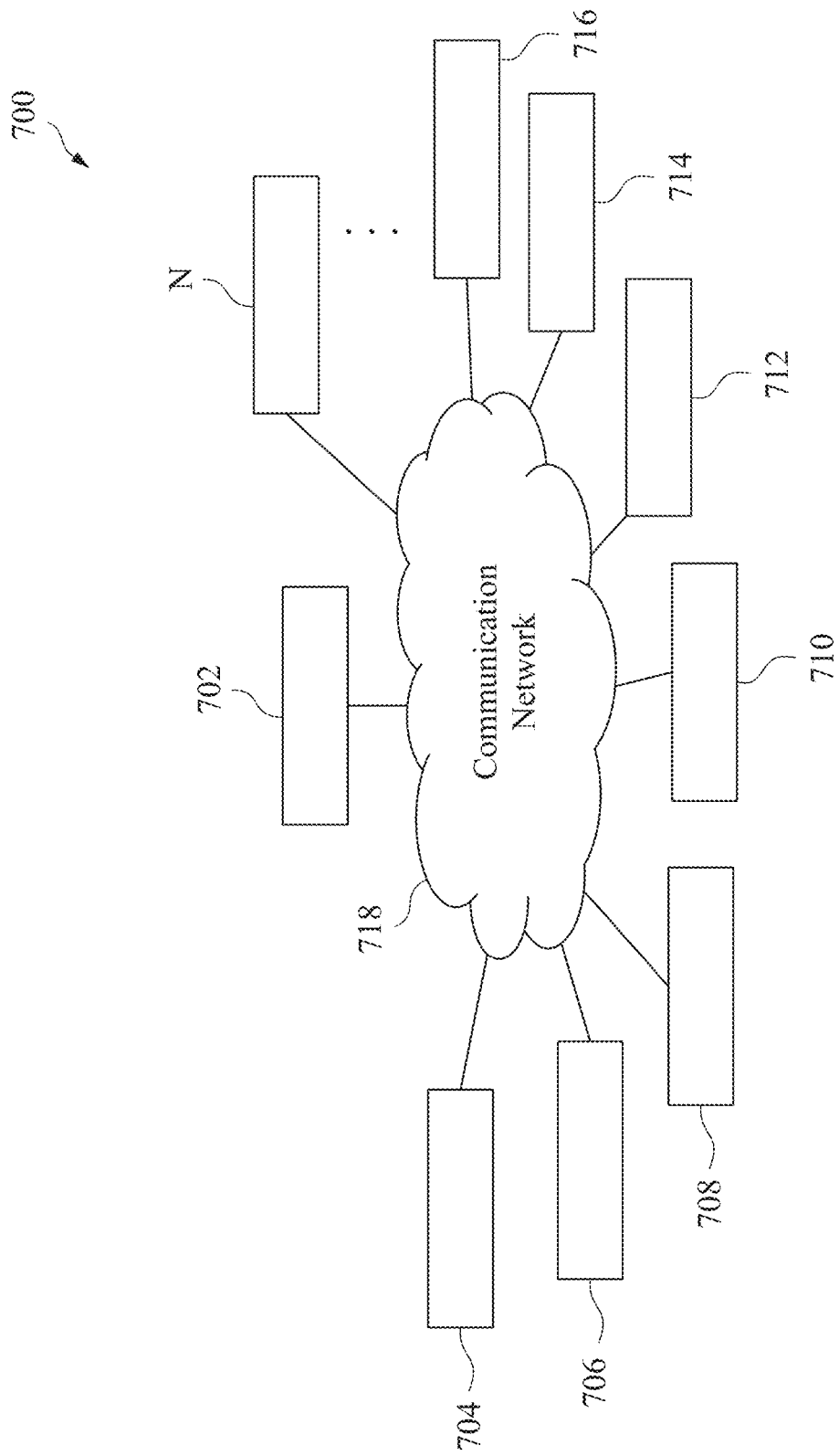
FIG. 10 illustrates an integrated circuit fabrication system according to various embodiments of the present disclosure.

FIG. 10 illustrates an integrated circuit fabrication system 700 according to embodiments of the present disclosure. The fabrication system 700 includes a plurality of entities 702, 704, 706, 708, 710, 712, 714, 716 . . . , N that are connected by a communications network 718. The network 718 may be a single network or may be a variety of different networks, such as an intranet and the Internet, and may include both wire line and wireless communication channels.

In an embodiment, the entity 702 represents a service system for manufacturing collaboration; the entity 704 represents an user, such as product engineer monitoring the interested products; the entity 706 represents an engineer, such as a processing engineer to control process and the relevant recipes, or an equipment engineer to monitor or tune the conditions and setting of the processing tools; the entity 708 represents a metrology tool for IC testing and measurement; the entity 710 represents a semiconductor processing tool, such as the semiconductor fabrication apparatus 400 discussed above with reference to FIG. 5; the entity 712 represents a virtual metrology module associated with the processing tool 710; the entity 714 represents an advanced processing control module associated with the processing tool 710 and additionally other processing tools; and the entity 716 represents a sampling module associated with the processing tool 710. It is understood that the controller 550 discussed above with reference to FIG. 8 may be integrated into one or more of these entities 702-716.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 714 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks, such as the tasks associated with optimizing the CCR values as discussed above.

The integrated circuit fabrication system 700 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results. For example, the reflectors 510 discussed above may be adjusted as a part of the recipe of an epitaxial process to achieve a desired thermal heating profile on the wafer.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 700 may enable collaboration and information access in such areas as design, engineering, and processing, metrology, and advanced processing control. Another capability provided by the IC fabrication system 700 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 11:
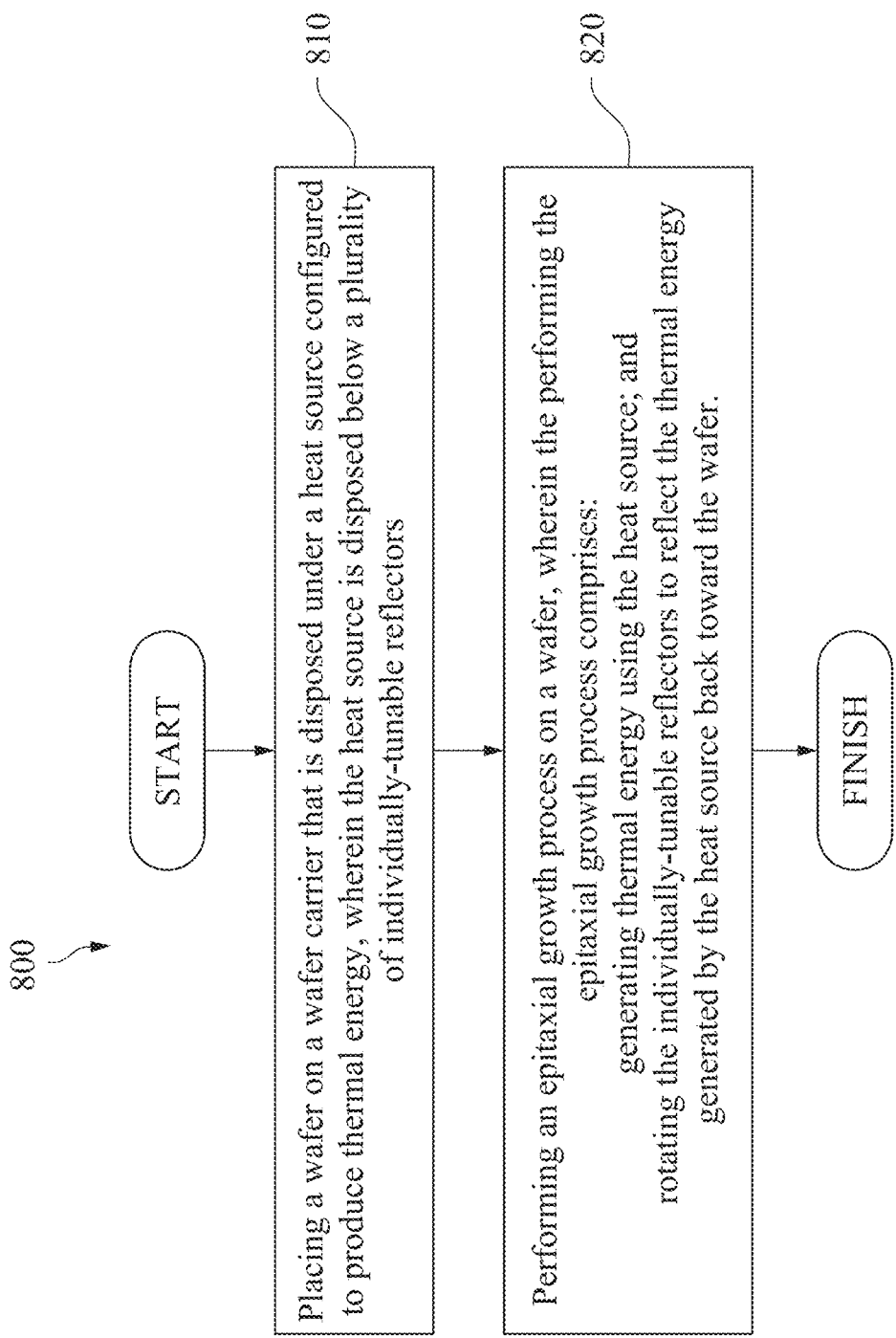
FIG. 11 is a flowchart illustrating a method of fabricating a semiconductor device according to embodiments of the present disclosure.

FIG. 11 is a flowchart illustrating a method 800 of fabricating a semiconductor device according to embodiments of the present disclosure. The method includes a step 810 of placing a wafer on a wafer carrier that is disposed under a heat source configured to produce thermal energy. The heat source is disposed below a plurality of individually-tunable reflectors.

The method 800 includes a step 820 of performing an epitaxial growth process on a wafer. The performing of the epitaxial growth process comprises a step of generating thermal energy using the heat source. The performing of the epitaxial growth process further comprises a step of rotating the individually-tunable reflectors to reflect the thermal energy generated by the heat source back toward the wafer.

In some embodiments, the rotating of the individually-tunable reflectors is performed such that the thermal energy is reflected toward an edge region of the wafer.

In some embodiments, the rotating of the individually-tunable reflectors is performed via a plurality of motors that are coupled to the individually-tunable reflectors, respectively.

In some embodiments, the rotating of the individually-tunable reflectors comprises rotating the reflectors in a counterclockwise direction or in a clockwise direction. The counterclockwise direction and the clockwise direction are each defined in a plane perpendicular to a surface of the wafer.

In some embodiments, the generating of the thermal energy comprises generating the thermal energy using a circular lamp disposed over an edge region of the wafer as the heat source. In other embodiments, the generating of the thermal energy comprises generating the thermal energy using a plurality of tubular lamps disposed over the edge region of the wafer as the heat source.

It is understood that additional steps may be performed to complete the method 800 of fabricating the semiconductor device. For example, the semiconductor may undergo one or more deposition, patterning, packaging, or testing processes However, for reasons of simplicity these additional steps are not discussed herein in detail.

The present disclosure offers advantages over conventional semiconductor devices and the fabrication thereof. It is understood, however, that other embodiments may offer additional advantages, and not all advantages are necessarily disclosed herein, and that no particular advantage is required for all embodiments. One advantage is that the individually-tunable reflectors allows for tunable thermal intensity on different heating zones of the wafer 300. For example, one region of the wafer may be heated to one temperature, while another region (which may be an adjacent region) of the wafer may be heated to a different temperature, merely by configuring the rotation angles of the reflectors located above these regions. Another advantage is the edge heating efficiency improvement over conventional systems. As discussed above, the individually-tunable reflectors allow for different regions of the wafer to be heated differently. Thus, when wafers tend to suffer from poor edge heating in an epitaxial process, the reflectors may be tuned in a manner to focus the reflected thermal radiation on the edge region of the wafer. Consequently, the heating efficiency is enhanced for the edge region of the wafer during epitaxial processes. This helps improve semiconductor device performance, such as critical dimension (CD), wafer acceptance test (WAT), etc. In addition, the individually-tunable reflectors can effectively eliminate temperature dead-zones. Thus, it can better provide a more stable and uniform heating system that can be used in a demanding fabrication environment, for example for technology nodes at or below the 10-nanometer node.

One aspect of the present disclosure involves a semiconductor fabrication apparatus. The semiconductor fabrication apparatus includes a wafer holder configured to hold a wafer. The semiconductor fabrication apparatus includes a heat-producing module disposed over the wafer holder. The semiconductor fabrication apparatus also includes a plurality of individually-tunable reflectors disposed over the heat-producing module. The individually-tunable reflectors are each configured to reflect heat produced by the heat-producing module toward the wafer holder.

Another aspect of the present disclosure involves a semiconductor fabrication system. The semiconductor fabrication system includes a wafer carrier configured to carry a wafer thereon. The semiconductor fabrication system includes a radiation source positioned above the wafer carrier. The radiation source is configured to emit thermal radiation. The semiconductor fabrication system includes a plurality of reflectors positioned above, and aligned with, an edge region of the wafer. The reflectors each have a reflective coating configured to reflect the thermal radiation. The semiconductor fabrication system includes a plurality of separately-controllable motors each coupled to a respective one of the reflectors. The motors are each configured to cause its respective reflector to rotate in a counterclockwise direction or a clockwise direction so as to redirect the thermal radiation back toward the edge region of the wafer. The semiconductor fabrication system includes a controller communicatively coupled to the plurality of motors, wherein the controller is configured to control each of the motors separately to cause each motors to rotate independently of other motors.

Yet another aspect of the present disclosure involves a method of fabricating a semiconductor device. A wafer is placed on a wafer carrier. The wafer carrier is disposed under a heat source configured to produce thermal energy. The heat source is disposed below a plurality of individually-tunable reflectors. An epitaxial growth process is performed on a wafer. The performing the epitaxial growth process comprises a step of generating thermal energy using the heat source. The performing the epitaxial growth process also comprises a step of rotating the individually-tunable reflectors to reflect the thermal energy generated by the heat source back toward the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor fabrication apparatus, comprising:
   a wafer holder configured to hold a wafer;
   a heat-producing module disposed over the wafer holder; and
   a plurality of individually-tunable reflectors disposed over the heat-producing module, wherein the individually-tunable reflectors are each configured to reflect heat produced by the heat-producing module toward the wafer holder, wherein the heat-producing module comprises a circular lamp that is disposed over, and aligned with, an edge portion of the wafer that the wafer holder is configured to hold.

2. The semiconductor fabrication apparatus of claim 1, wherein the individually-tunable reflectors are each configured to reflect the heat toward an edge region of the wafer that the wafer holder is configured to hold.

3. The semiconductor fabrication apparatus of claim 1, wherein:
   the individually-tunable reflectors are each configured to rotate about a respective axis; and
   the respective axis each extends in parallel to a surface of the wafer that the wafer holder is configured to hold.

4. The semiconductor fabrication apparatus of claim 3, further comprising a plurality of motors that are each coupled to a different individually-tunable reflector, respectively, wherein the motors are configured to cause its respective individually-tunable reflector to rotate in a counter-clockwise direction or in a clockwise direction.

5. The semiconductor fabrication apparatus of claim 1, wherein the individually-tunable reflectors each form a downwardly-bending cup in a cross-sectional view.

6. The semiconductor fabrication apparatus of claim 1, wherein the individually-tunable reflectors each have a reflective metal coating.

7. The semiconductor fabrication apparatus of claim 1, wherein:
   the heat-producing module comprises a plurality of elongate lamps, the elongate lamps being disposed over an edge portion of the wafer that the wafer holder is configured to hold;
   the plurality of elongate lamps are each elongated along a respective axis that radially extends toward a point above a center of the wafer holder; and
   each of the individually-tunable reflectors is disposed over, and aligned with, a respective one of the elongate lamps.

8. The semiconductor fabrication apparatus of claim 1, further comprising a quartz cover disposed between the wafer holder and the heat-producing module.

9. The semiconductor fabrication apparatus of claim 1, wherein the semiconductor fabrication apparatus comprises an epitaxial growth chamber.

10. The semiconductor fabrication apparatus of claim 1, wherein the plurality of individually-tunable reflectors are collectively arranged into a ring-like structure.

11. A semiconductor fabrication system, comprising:
a wafer carrier configured to carry a wafer thereon;
a radiation source positioned above the wafer carrier, the radiation source being configured to emit thermal radiation;
a plurality of reflectors positioned above, and aligned with, an edge region of the wafer, the reflectors each having a reflective coating configured to reflect the thermal radiation;
a plurality of separately-controllable motors each coupled to a respective one of the reflectors, wherein the motors are each configured to cause its respective reflector to rotate in a counterclockwise direction or a clockwise direction so as to redirect the thermal radiation back toward the edge region of the wafer; and
a controller communicatively coupled to the plurality of motors, wherein the controller is configured to control each of the motors separately to cause each motors to rotate independently of other motors;
wherein:
the radiation source comprises a plurality of tubular lamps that are positioned above the edge region of the wafer; and
each tubular lamp extends radially toward a point above a center of the wafer.

12. The semiconductor fabrication system of claim 11, wherein the radiation source comprises a ring-like structure that is positioned above, and aligned with, the edge region of the wafer.

13. The semiconductor fabrication system of claim 11, wherein:
the reflectors each define a downward-facing recess in a cross-sectional view; and
each downward recess is aligned with a respective one of the tubular structures.

14. The semiconductor fabrication system of claim 11, wherein the wafer carrier is housed within an epitaxial growth chamber.

15. The semiconductor fabrication system of claim 11, wherein the individually-tunable reflectors are located over the edge region of the wafer but not over a middle portion of the wafer.

16. A method of fabricating a semiconductor device, comprising:
placing a wafer on a wafer carrier that is disposed under a heat source configured to produce thermal energy, wherein the heat source is disposed below a plurality of individually-tunable reflectors; and
performing an epitaxial growth process on a wafer, wherein the performing the epitaxial growth process comprises:
generating thermal energy using the heat source; and
rotating the individually-tunable reflectors to reflect the thermal energy generated by the heat source back toward the wafer;
wherein the generating the thermal energy comprises generating the thermal energy using a circular lamp disposed over an edge region of the wafer as the heat source, or by using a plurality of tubular lamps disposed over the edge region of the wafer as the heat source.

17. The method of claim 16, wherein the rotating of the individually-tunable reflectors is performed such that the thermal energy is reflected toward an edge region of the wafer.

18. The method of claim 17, wherein the rotating is performed such that an amount of the thermal energy reflected toward the edge region of the wafer is greater than an amount of the thermal energy reflected toward a center region of the wafer.

19. The method of claim 16, wherein the rotating of the individually-tunable reflectors is performed via a plurality of motors that are coupled to the individually-tunable reflectors, respectively.

20. The method of claim 16, wherein the rotating of the individually-tunable reflectors comprises rotating the reflectors in a counterclockwise direction or in a clockwise direction.

* * * * *